United States Patent [19]
O et al.

[11] Patent Number: 6,022,460
[45] Date of Patent: Feb. 8, 2000

[54] ENHANCED INDUCTIVELY COUPLED PLASMA REACTOR

[75] Inventors: Beam-Hoan O, Incheon-si; Se-Geun Park, Sungnam-si; Jae Seong Jeong, Seoul; Chul ho Kim, Incheon-si, all of Rep. of Korea

[73] Assignee: Inha University Foundation, Rep. of Korea

[21] Appl. No.: 09/273,996

[22] Filed: Mar. 22, 1999

[30] Foreign Application Priority Data

Jan. 18, 1999 [KR] Rep. of Korea .......................... 99-1238

[51] Int. Cl.$^7$ .................................................. C23C 14/34
[52] U.S. Cl. ................................. 204/298.06; 204/298.08; 204/298.34; 204/298.16; 156/345; 118/723 IR; 118/723 I; 427/569; 216/67; 216/68; 216/70
[58] Field of Search .......................... 204/298.06, 298.08, 204/298.34, 298.16; 156/345; 118/723 IR, 723 I; 427/569; 216/67, 68, 70

[56] References Cited

U.S. PATENT DOCUMENTS

| | | | |
|---|---|---|---|
| 5,609,774 | 3/1997 | Yamazaki et al. | 216/69 |
| 5,683,548 | 11/1997 | Hartig et al. . | |
| 5,858,259 | 1/1999 | Hirose et al. | 216/70 |
| 5,888,414 | 3/1999 | Collins et al. | 216/68 |

OTHER PUBLICATIONS

Jeong et al, "The Generation of Uniform High Density Plasma of Inductively Coupled Plasma Etcher Enhanced by Alternating Axial Magnetic Filed," Proceedings of IEEK Fall Conference '98, vol. 21, No. 2, pp. 589–592, Nov. 1998.

Jeong et al., Proceedings of IEEK Fall Conference '98, vol. 21, No. 2, hed by IEEK on Nov. 21, 1998.

*Primary Examiner*—Alan Diamond
*Attorney, Agent, or Firm*—Bachman & LaPointe, P.C.

[57] ABSTRACT

An enhanced inductively coupled plasma reactor which comprises; a chamber; a power supply for providing radio-frequencies necessary to generate plasma within the chamber; an antenna for producing electric fields and magnetic fields with a radio-frequency power from the power supply to generate plasma within the chamber; Helmholtz coils for shaking the plasma with intermittent modulation of a weak magnetic field to increase the density of the plasma and decrease the electron temperature and enhance the uniformity of the plasma, the Helmholtz coils consisting of two coils which are symmetrically arranged with a common axis, winding around the chamber at an upper position and a lower position, respectively, the weak magnetic field being produced by providing a combination of a direct current and an alternating current to the Helmholtz coils; a wafer stage and support; a bias RF power supply for controlling ion energies, connected to the wafer stage; and a matching box for optimally controlling and transferring the power from the bias RF power supply. Axis-directed magnetic fields which vary with time are formed by the provision of the combination of the currents. When they are controlled in various cycles, the plasma can be effectively shaken and a resonant effect occurs, thereby increasing the ion density and decreasing the electron temperature.

5 Claims, 5 Drawing Sheets

ENHANCED INDUCTIVELY COUPLED PLASMA REACTOR

BACKGROUND OF THE INVENTION

1. Field of the Invention

The present invention relates, in general, to an enhanced inductively coupled plasma reactor and, more particularly, to an enhanced inductively coupled plasma reactor using the periodical intermittence of a magnetic field produced in the axis direction by Helmholtz coils.

2. Description of the Prior Art

Generally, plasma is a highly ionized gas, composed entirely of a nearly equal number of positive and negative free charges, so that quasineutrality appears on the whole. In contrast to the particles of neutral gas which affect each other by collision, the particles of plasma, if they are apart at a distance, affect each other by coulomb forces, acting collectively.

Recent active research on such plasma, including naturally existing plasma, has allowed it to be usefully applied for a variety of fields including, for example, light sources, display devices, controlled nuclear fusion reactors, value-added then film deposition, high-temperature heat sources and waste disposal. Particularly, application of plasma has already been as an indispensable means for various industries in an information-intensive society.

Depending on gas pressure, ionization degree, temperature, density and the like, plasma shows various properties. Of various plasmas, a glow discharge is of low-temperature plasma because its operating pressure is relatively low and the collision frequency between electrons and neutrons or between electrons and ions is insufficient to achieve a thermal equilibrium therebetween, so that the ions or neutrons are relatively low in temperature while the electrons produce a significantly high temperature. Processing of semiconductor devices is usually done by plasma-enhanced chemical vapor deposition (PECVD), reactive-ion etching (RIE), sputtering and the like.

Most of the plasma apparatuses used in reactive ion etching have been of the capacity-coupling plasma (CCP) of diode type in which radio frequencies in the range of hundreds kHz to tens MHz are applied across tow electrodes, but a significant advance in the integration of semiconductor devices with design rule reduction into 0.5 µm or less, causes the application of CCP for dry etch to be problematic in many aspects.

As solutions for the problems, there were suggested various low-pressure, high-density plasma sources, such as ECR plasma using electron spin resonance, helicon plasma using helicon or whistler waves, a helical resonator exciting slow waves, inductively coupled plasma and electron beam exciting plasma for the purpose of etch application. They are now commercialized.

The basic concept of such low-pressure, high-density plasma apparatuses is derived from the study on the plasma of high energy density, such as controlled nuclear fusion and they are, in many cases, applied to the semiconductor device processing by appropriate modification of their input power. Commonly, they have the advantages of being high in ionization efficiency relative to flat electrode-type plasma and of being able to independently control ion energy by virtue of the separate structure of a plasma-generating part from a bias-applying part.

Of the above-mentioned plasma sources, flat inductively coupled plasma advantageously allows a wafer to have a large area available and an apparatus to be of highly simple structure, as shown in FIG. 1. For these advantages, active research has been and continues to be directed to the development of flat inductively coupled plasma. As a result, reactors which can use the flat inductively coupled plasma in etching polysilicon or aluminum came into the market.

The inductively coupled plasma reactors developed thus far, are useful for many semiconductor processes in terms of the uniform density of plasma in a particular space of the chambers, for example, in the space over a wafer, but exhibit a limit in endowing wafers with a large area because the plasma becomes nonuniform in density as it goes from a chamber's central site, in which the wafer is disposed, to a chamber's wall. In addition, there occurs an increase of electron temperature in those reactors, causing a serious problem of the charge accumulation upon submicron pattern etch, accompanied by the derivative problems including a notch effect, a microloading effect and a microtrench.

SUMMARY OF THE INVENTION

The intensive and thorough research repeated by the inventors resulted in the finding that an axis-directed weak magnetic field formed by the Helmholtz coils which are arranged with a common axis and wind around the chamber of an inductively coupled plasma reactor at an upper position and a lower position, can be used to intermittently modulate the plasma, bringing about a significant improvement in the uniformity, the ion density, and electron temperature of the plasma.

Therefore, it is an object of the present invention to overcome the above problems encountered in above prior arts and to provide an enhanced inductively coupled plasma reactor by which the uniformity and efficiency in ashing or etching processes can be remarkably enhanced.

In accordance with an aspect of the present invention, the above object could be accomplished by a provision of an enhanced inductively coupled plasma reactor, comprising: a chamber for providing a space in which plasma generated is maintained and plasma reaction processes are carried out; a power supply for providing radio-frequencies necessary to generate plasma within the chamber; an antenna for producing electric fields and magnetic fields with a radio-frequency power from the power supply to generate plasma within the chamber, the antenna being in any form; Helmholtz coils for shaking the plasma with intermittent modulation of a weak magnetic field to increase the density of the plasma and decrease electron temperature and enhance the uniformity of the plasma, the Helmholtz coils consisting of two coils which are symmetrically arranged with a common axis, winding around the chamber at an upper position and a lower position, respectively, the weak magnetic field being produced by providing a combination of a direct current and an alternating current to the Helmholtz coils; a wafer stage and support for supporting a target which is treated by the plasma reaction processes and maintaining the temperature of the wafer; a bias RF power supply for controlling ion energies, connected to the wafer stage; and a matching box for optimally controlling and transferring the power from the bias RF power supply.

In accordance with another aspect of the present invention, there is provided the enhanced inductively coupled plasma reactor of the above structure which further comprises a coil power supply for providing low-frequency powers to the Helmholtz coils; and a power controller for periodically controlling the power provision of the coil power supply.

BRIEF DESCRIPTION OF THE DRAWINGS

The above and other objects and aspects of the invention will become apparent from the following description of embodiments with reference to the accompanying drawings in which.

DETAILED DESCRIPTION OF PREFERRED EMBODIMENTS

The application of the preferred embodiments of the present invention is best understood with reference to the accompanying drawings.

Figure 2:
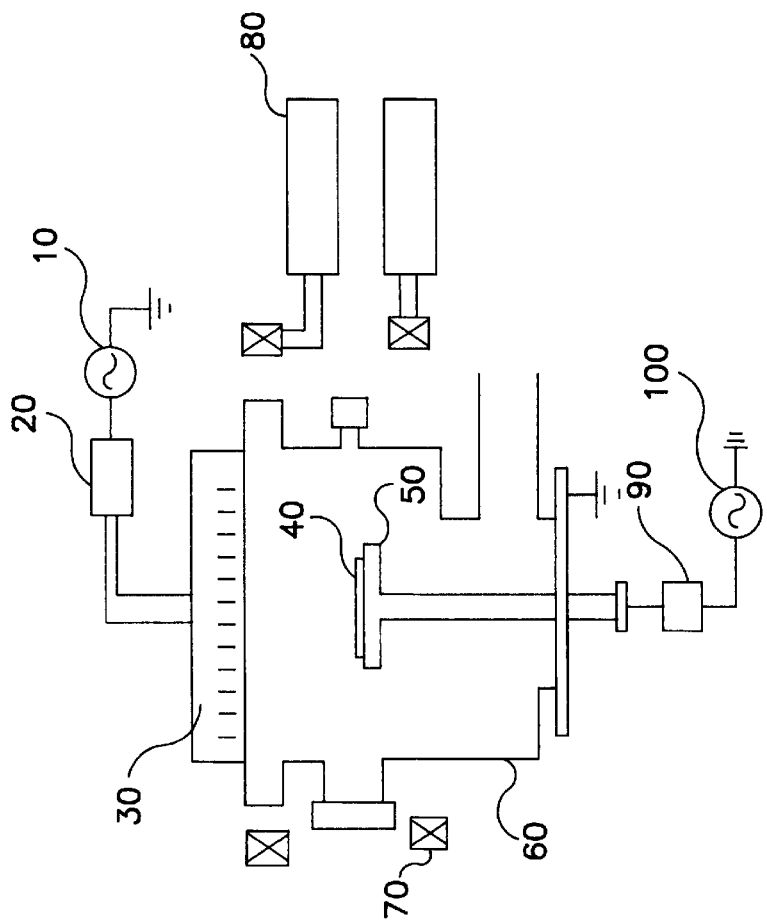
FIG. 2 is a schematic representation showing a system structure of a enhanced inductively coupled plasma reactor according to the present invention.
Figure 1:
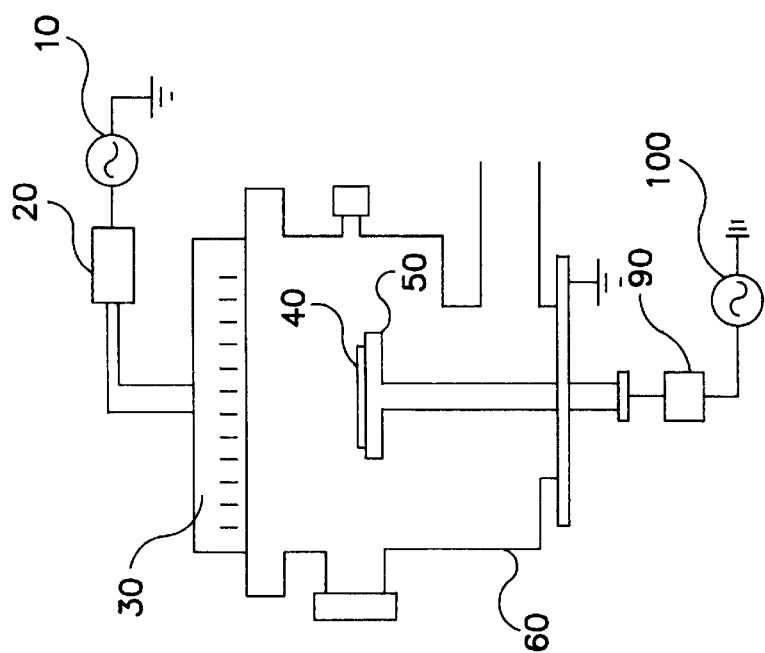
FIG. 1 is a schematic representation showing a system structure of a conventional inductively coupled plasma reactor.

FIG. 2 shows a system structure of an enhanced inductively coupled plasma reactor in accordance with an embodiment of the present invention. As shown in this figure, the enhanced inductively coupled plasma reactor of the present invention is composed mainly of an RF power supply 10, a matching box 20, an antenna 30, a wafer 40, a stage and support 50 for wafer, a chamber 60, Helmholtz coils 70, a power supply and controller 80 for the coils, a matching box 90 and a bias RF power supply 100.

The RF power supply 10 provides a high frequency power of 2 MHz or 13.56 MHZ, enough to generate plasma.

Acting to optimally transfer radio frequency power, the matching box 20 is established between the RF power supply and a load. In order to effectively generate plasma, the reflected wave power from the reactor, that is, the antenna 30, must be minimized by matching the impedance of the RF power supply with that of the reactor system. Because the impedance of the system varies according to processes, it is effective to employ an automatic matching transformer which can automatically match the impedance in response to the reflected wave.

For the antenna 30, it is made of a material superior in electric conductivity, typically, oxygenless copper, in order to minimize the resistance loss. Because a conduction path for RF currents is limited to the surface of the antenna, the plating with gold or silver further reduces the resistance loss of the antenna. A cooling line is provided with the aim of preventing the coil from overheating upon plasma operation for a long period of time. It is preferred that the antenna has such a shape that the electric field and magnetic field generated are formed as uniformly as possible. For example, the antenna may have a flat shape or a bell-jar shape.

The wafer 40 is a substrate in which active devices or integrated circuits are constructed and may be selected from silicon substrates and various objects suitable for plasma processing.

Supporting the wafer 40, the stage and support 50 is formed within the chamber to be described later and preferably in the central site of the chamber. To the wafer support 50 is provided a cooling line which prevents overheated plasma from damaging the wafer, an elevation controller by which the position of the wafer support is set, and an RF power supply for controlling an ion energy, by which the cations of the plasma generated are made to descend toward the wafer.

The chamber 60 provides a space in which the plasma generated is maintained and plasma reaction processes are carried out.

Making uniform over the whole space of the chamber the electromagnetic field generated from the antenna, the Helmholtz coils 70 consist of a pair of coils which are arranged with a common axis. They are apart from each other in a proper distance with the wafer as the symmetrical axis, winding around the chamber. They also have equal number of turns and equal radii R. In addition, they are equal in impedance and pure resistance. The magnetic field distribution within the chamber is changed with the distance between the coils, the currents flowing the coils, and the number of turns.

Since the Helmholtz coils 70 are characterized in that the distance therebetween is equal to the radii of the coils, the state of the plasma generated can be modified by changing the radii of the coils, together with the distance therebetween.

The power supply and controller 80 provides low power to the Helmholtz coils 70 to produce a weak magnetic field within the chamber and controls periodically the power provision. A pair of the Helmholtz coils which are, as mentioned above, arranged in two layers with a common axis and one of them is provided with a direct current while the other is provided with an alternating current.

Where an alternating current magnetic field is produced at the upper coil with a direct current magnetic field at the lower coil (hereinafter, this case is represented as "AC&DC"), the upper coil is provided with a low frequency alternating current, for example, an alternating current with less than 100 Hz in a preferred system while the lower coil is provided with a direct current. On the other hand, where a direct current magnetic field and an alternating current are respectively formed at the upper coil and the lower coil (hereinafter, this case is represented as "DC&AC"), the upper coil is supplied with a direct current while the lower coil is provided with an alternating current of a low frequency and preferably with an alternating current of less than 100 Hz.

When the Helmholtz coils are provided with an alternating current and a direct current as described above, a weak magnetic field is produced in the alternating axis direction. In accordance with the present invention, the plasma which is generated by the electric field and magnetic field, based on the radio frequency from the antenna, can be shaken to achieve a uniform distribution within the chamber by applying the magnetic field produced at the Helmholtz coils to the plasma, whereby a remarkable effect of giving rise to a decrease in electron temperature and an increase in plasma density can be obtained.

The matching box 90 serves to maximize the transfer of the power from the bias RF power supply 90.

With connection to the wafer stage (electrode), the bias RF power supply 100 plays a role in controlling an ion energy so that it is used for ion aid processes.

The enhanced inductively coupled plasma reactor with the above-mentioned structure in accordance with the present invention can be applied for a variety of the processes utilizing plasma, such as sputtering, chemical deposition and the like.

A detailed description will be given of the operation of the enhanced inductively coupled plasma reactor according to the present invention, particularly in terms of an etching function, below.

First, a wafer on which an etch mask is formed is loaded upon the wafer support positioned at the central site of the chamber which is, then, kept constantly in pressure with the aid of a vacuum pump (not shown). Etching gas is introduced through a valve (not shown) to the chamber.

Thereafter, a radio frequency power of 2 MHZ or 13.56 MHZ, which is sufficient to produce plasma, is generated by the RF power supply and transferred to the matching box. At the matching box, the transferred power is so matched as to be optimally ready for transfer, followed by the provision of the power to the antenna.

Typically, the antenna is flat with a spiral contour. This conformation of the antenna enables the fed gas to enter a uniform plasma state. As such, the electric field and magnetic field produced by the high frequency from the antenna functions to ionize the etching gas and to maintain the plasma generated. The electromagnetic field energy provided from the antenna is, however, restrained by the high conductivity of the plasma, so that the density of the plasma is limitedly increased.

As a means to overcome this, it is known that, when a new mode is produced by the application of a weak magnetic field in the axis direction, the plasma density is a little enhanced. However, this means has a limit in enhancing the uniformity of the plasma. Therefore, there is needed a novel method by which both the ashing rate and the plasma uniformity are increased upon etching.

In accordance with the present invention, two Helmholtz coils are wound around the chamber at an upper position and at a lower position, each, in order to enhance the ashing rate and the plasma uniformity. Particularly, while an axis-directed alternating current magnetic field is produced upward or downward by applying one of the Helmholtz coils with an alternating current, the other is connected to a direct current source, so as to bring about an eddy effect of an alternating current on a direct current as the central figure. This effect magnetizes the plasma, so that the electromagnetic waves with various frequencies are excited into the plasma, thereby leading to a change dispersion relation in plasma and to a mode resonance to effectively transfer the power, and shaking the plasma itself effectively by use of the magnetic field which modulates with time.

For a test reactor which exhibited preferable functions, these effects were particularly remarkable when the frequency of the current power source was 40 Hz, such that there was obtained an exceptional result in that the plasma density increased and the electron temperature decreased.

Figure 3:
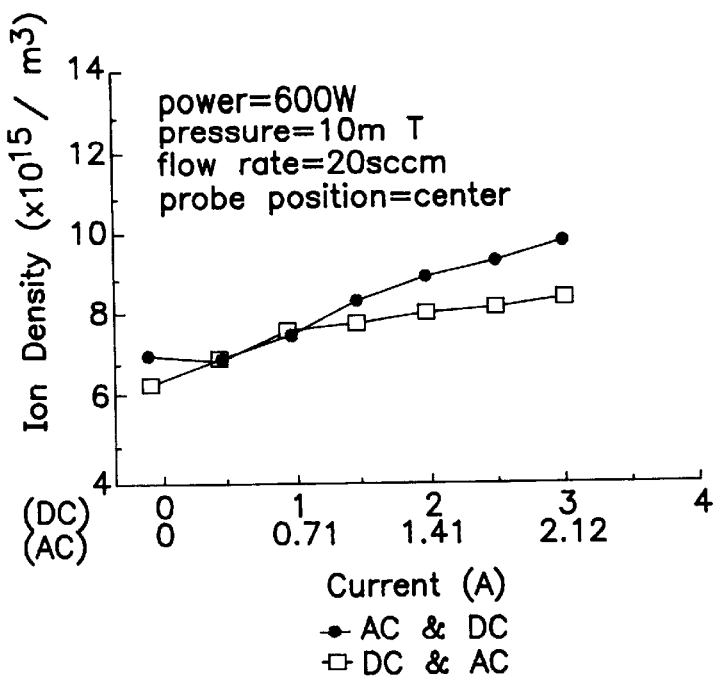
FIG. 3 is a plot showing the change in the ion density of the plasma with the current provided, in accordance with a preferred embodiment of the present invention.
Figure 4:
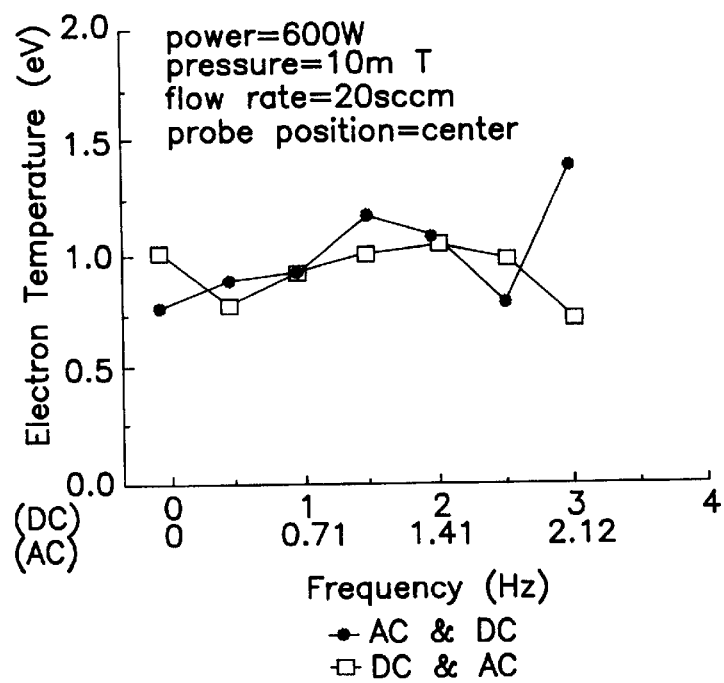
FIG. 4 is a plot showing the change in the electron temperature of the plasma with the current provided, in accordance with a preferred embodiment of the present invention.

FIG. 3 shows the relation between ion density changes and current changes and FIG. 4 shows the relation between electron temperature changes and current changes, in accordance with a preferred embodiment of the present invention. That is, when an alternating current magnetic field is formed at the upper coil with a direct current magnetic field at the lower coil (AC&DC) or when a direct current magnetic field is formed at the upper coil with an alternating current magnetic field at the lower coil (DC&AC), the ion density and the electron temperature are respectively plotted against the current change. In both cases, the ion density increases linearly in proportion to the current. The increase rate is smaller for the DC&AC than for the AC&DC. As for the electron temperature, it holds on to a low and stable level of around 1 eV with respect to the two magnetic field application cases. In addition, it was certified that the kinetic energy of electrons was lowered and stabilized under a particular condition.

Figure 5:
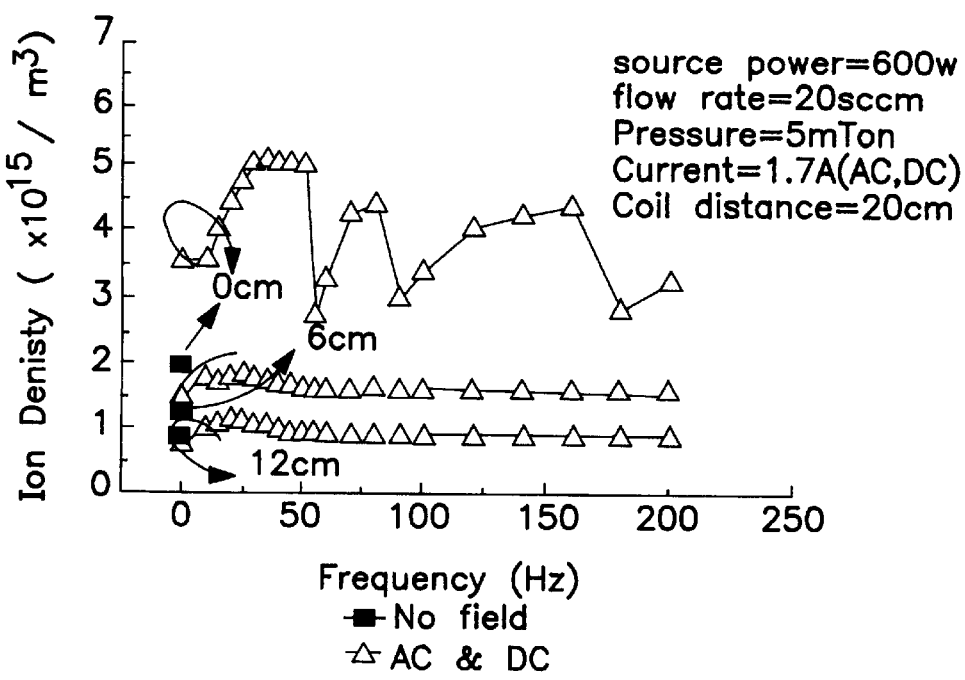
FIG. 5 is a plot showing the change in the ion density of the plasma with the frequency formed, in accordance with a preferred embodiment of the present invention.

FIG. 5 shows the relation of the ion density of plasma against frequency change, according a preferred embodiment of the present invention. Particularly, the ion density of plasma is plotted for three positions of the chamber with regard to the frequency changes when using a current of 1.7 A (about 15 Gauss).

As the frequency increases from 0 Hz in the graph, the ion density at the central position of the chamber is repetitively increased and decreased with the highest point at the range of 40 Hz to 50 Hz. It was certified that the low ion densities at the positions near the wall of the chamber were able to be increased at a particular frequency.

Figure 6:
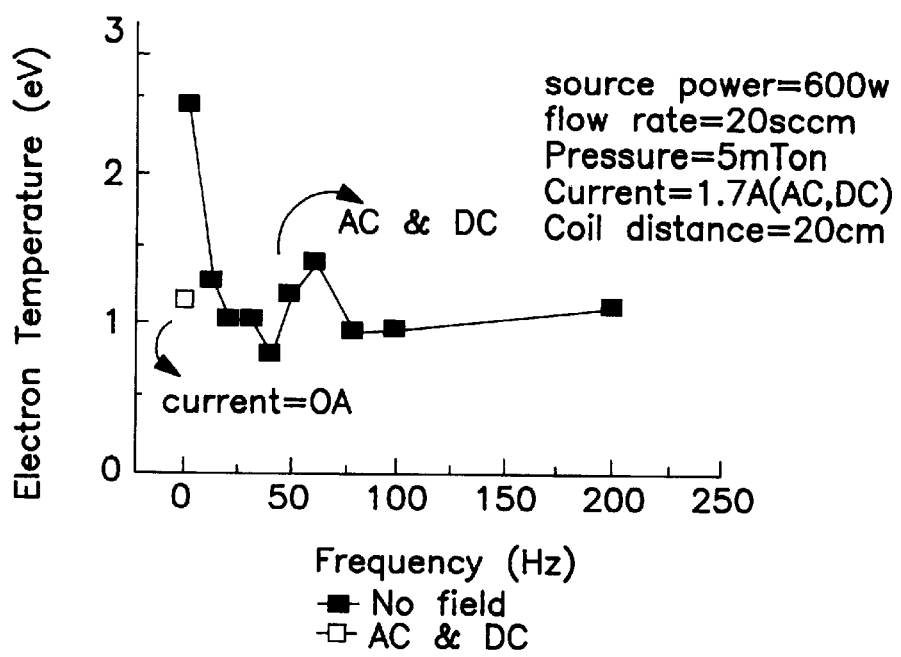
FIG. 6 is a plot showing the change in the electron temperature for the plasma with the frequency formed, in accordance with a preferred embodiment of the present invention.

With reference to FIG. 6, there is shown the relation between the electron temperature and the frequency, according to a preferred embodiment of the present invention. Particularly, the electron temperature at the central position of the chamber is plotted with regard to frequency when using 1.7 A (about 15 Gauss). As shown in this plot, the electron temperature, like the above ion density, is repetitively increased and decreased with the minimal temperature at 40 Hz.

A photoresist ashing process was carried out with the expectation that a relatively low electron temperature at the level of around 1 eV and a little bit enhancement of the ion density at the spaces near the wall of the chamber could allow an increase in the uniformity of the plasma and avoid the problems which occur on the surface of a wafer upon etching.

Figure 7:
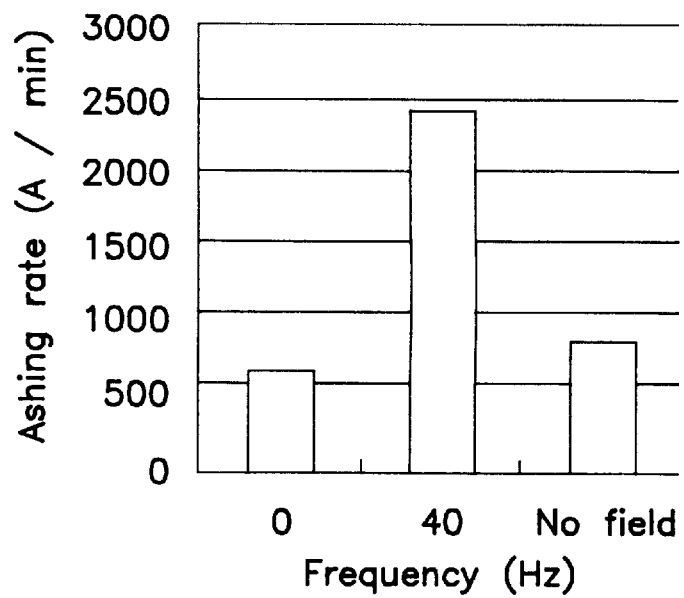
FIG. 7 is a histogram showing the relation between the photoresist-ashing rate of the plasma and the frequency provided to the plasma, in accordance with a preferred embodiment of the present invention.
Figure 8:
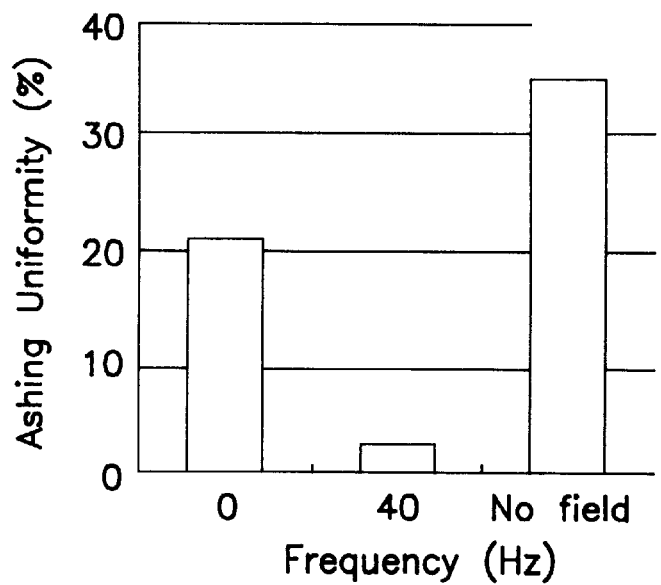
FIG. 8 is a histogram showing the relation between the photoresist-ashing uniformity of the plasma and the frequency provided to the plasma, in accordance with a preferred embodiment of the present invention.

Referring to FIGS. 7 and 8, there are respectively shown photoresist ashing rates and ashing uniformities according to frequency in a preferred embodiment of the present invention. As seen in these figures, best values in the ashing rate and the ashing uniformity were obtained at 40 Hz. That is, a high ion density and a low electron temperature lead to ashing photoresist uniformly and effectively.

Therefore, the inductively coupled plasma enhanced by the alternating current magnetic field in accordance with the present invention has the advantage of being higher in plasma density and lower in electron temperature than conventional inductively coupled plasma, thereby effectively preventing the problems which occur in conventional etching processes.

Figure 9:
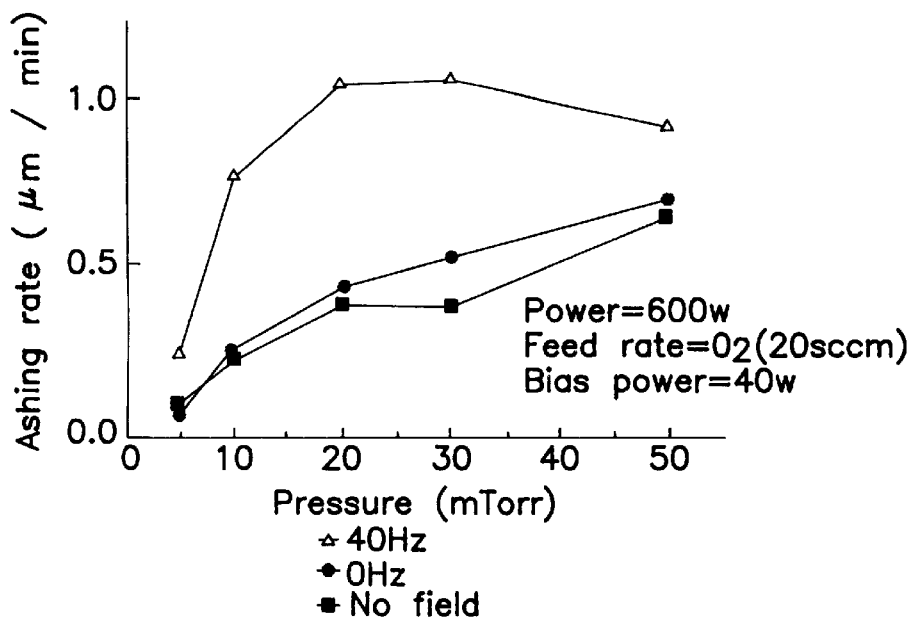
FIG. 9 is a plot showing the change in the photoresist-ashing rate of the plasma with the pressure within the chamber, in accordance with a preferred embodiment of the present invention.
Figure 10:
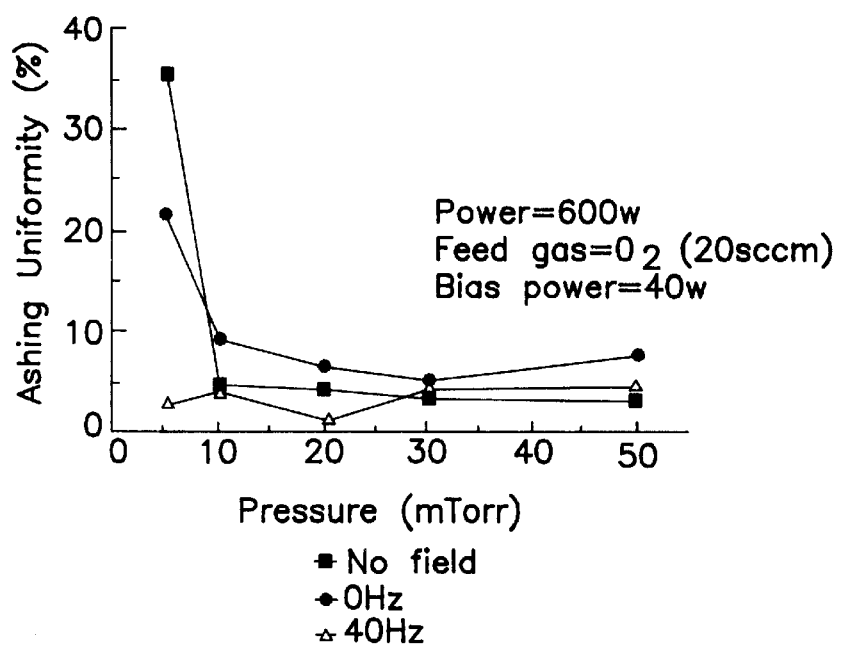
FIG. 10 is a plot showing the change in the photoresist-ashing uniformity of the plasma with the pressure within the chamber, in accordance with a preferred embodiment of the present invention.

In FIGS. 9 and 10, the changes in photoresist ashing rate and ashing uniformity are respectively shown for three field conditions with regard to the pressure within the chamber, according to a preferred embodiment of the present invention.

As shown in FIG. 9, the ashing rate increases with the pressure with the far superiority of the 40 Hz field condition to the other conditions. The data obtained in FIG. 10 demonstrate that the ashing uniformity is always maintained at 5% or less under the 40 Hz condition. Particularly at 20 mTorr, the ashing uniformity under the 40 Hz condition is surprisingly reduced into 1% or less.

As described hereinbefore, uniform plasma with a high ion density can be generated at the frequencies useful for ashing or etching processes by use of the enhanced inductively coupled plasma reactor of the present invention, in which Helmholtz coils that wind around the chamber at an upper position and a lower position, are provided with a combination of a direct current and an alternating current and the axis-directed magnetic field produced is intermittently modulated to cause a resonance of plasma mode.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. An enhanced inductively coupled plasma reactor, comprising:

a chamber for providing a space in which plasma generated is maintained and plasma reaction processes are carried out;

a power supply for providing radio-frequencies necessary to generate plasma within the chamber;

an antenna for producing electric fields and magnetic fields with a radio-frequency power from the power supply to generate plasma within the chamber, said antenna being in any form;

Helmholtz coils for shaking the plasma with intermittent modulation of a weak magnetic field to increase the density of the plasma and enhance the uniformity of the plasma, said Helmholtz coils consisting of two coils which are symmetrically arranged with a common axis, winding around the chamber at an upper position and a lower position, respectively, said weak magnetic field being produced by providing a combination of a direct current and an alternating current to said Helmholtz coils;

a wafer stage and support for supporting a target which is treated by the plasma reaction processes and maintaining the temperature of the wafer;

a bias RF power supply for controlling ion energies, connected to the wafer stage; and a matching box for optimally controlling and transferring the power from the bias RF power supply.

2. An enhanced inductively coupled plasma reactor as set forth in claim 1, further comprising:

a coil power supply for providing low-frequency powers to the Helmholtz coils; and a power controller for periodically controlling the power provision of said coil power supply.

3. An enhanced inductively coupled plasma reactor as set forth in claim 2, wherein said Helmholtz coils are provided with a low frequency less than 100 Hz.

4. An enhanced inductively coupled plasma reactor as set forth in claim 1, wherein said plasma is modified in its condition by changing the radii of the coils and the distance therebetween on the basis of the Helmholtz coil definition in which the radii of the two coils is equal to the distance therebetween.

5. An enhanced inductively coupled plasma reactor as set forth in claim 4, wherein any one of said two coils is provided with a direct current while the other is provided with an alternating current.

* * * * *